United States Patent
Kanzaki et al.

(10) Patent No.: US 6,765,818 B2
(45) Date of Patent: Jul. 20, 2004

(54) SEMICONDUCTOR MEMORY HAVING MEMORY CELLS AND DEVICE FOR CONTROLLING DATA WRITTEN IN THE SEMICONDUCTOR MEMORY

(75) Inventors: Teruaki Kanzaki, Tokyo (JP); Takashi Utsumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/383,577

(22) Filed: Mar. 10, 2003

(65) Prior Publication Data

US 2004/0047178 A1 Mar. 11, 2004

(30) Foreign Application Priority Data

Sep. 10, 2002 (JP) .......................................... 2002-264275

(51) Int. Cl.[7] .............................................. G11C 11/00
(52) U.S. Cl. ........................ 365/154; 365/156; 365/226
(58) Field of Search ................................ 365/154, 156, 365/205, 226

(56) References Cited

U.S. PATENT DOCUMENTS 5,325,325 A * 6/1994 Azuma ........................ 365/156
5,420,817 A * 5/1995 Kitagawa et al. ............ 365/226
6,504,788 B1 * 1/2003 Nii et al. ...................... 365/154
6,580,653 B2 * 6/2003 Yamanaka .................... 365/205

FOREIGN PATENT DOCUMENTS

JP          5-314776          11/1993

* cited by examiner

Primary Examiner—Trong Phan
(74) Attorney, Agent, or Firm—Burns, Doane, Swecker & Mathis, L.L.P.

(57) ABSTRACT

Each memory cell of an SRAM has normally a pair of inverters cross-connected to each other, a pair of transistors connected to output ends of the inverters respectively, a word line connected to gates of the transistors, and a bit line and an inverted bit line connected to the transistors respectively. To produce a storage data fixing memory cell functioning as that of a ROM from one normal memory cell, an input end of one inverter is disconnected from the output end of the other inverter and is connected to a low electric potential terminal or is connected to a high electric potential terminal. Therefore, preset data can be stored in the storage data fixing memory cell without changing characteristics of the SRAM in the changing of the normal cell memory to the storage data fixing memory cell.

9 Claims, 8 Drawing Sheets

SEMICONDUCTOR MEMORY HAVING MEMORY CELLS AND DEVICE FOR CONTROLLING DATA WRITTEN IN THE SEMICONDUCTOR MEMORY

BACKGROUND OF THE INVENTION

1. Field of the Invention

The present invention relates generally to a semiconductor memory having a plurality of memory cells and a semiconductor memory write-in control device for controlling data written in the semiconductor memory, and more particularly to a semiconductor memory and a semiconductor memory write-in control device in which a plurality of storage value fixing memory cells functioning as those of a read only memory are arranged.

2. Description of Related Art

FIG. 6 is a view showing the configuration of a conventional memory cell. In FIG. 6, BL denotes a bit line. BL(inverted) denotes an inverted bit line set to a level opposite to that of the bit line BL. WL denotes a word line set to a high level or a low level according to an address signal. INV1 and INV2 indicate a pair of inverters cross-connected to each other so as to connect an input end of one inverter to an output end of the other inverter. T1 and T2 indicate a pair of n-channel metal-oxide-semiconductor (MOS) transistors connected to both the bit line BL and the inverted bit line BL(inverted) respectively. An output end of the inverter INV1 is connected to the transistor T1, and an output end of the inverter INV2 is connected to the transistor T2. The word line WL is connected to gates of the transistors T1 and T2. When the word line WL is set to the high level, the transistors. T1 and T2 are turned on. A conventional memory cell (MC) 10 is composed of the transistors T1 and T2 and the inverters INV1 and INV2.

FIG. 7 is a view showing the configuration of a conventional random access memory (RAM) representing a conventional semiconductor memory. In FIG. 7, S11 denotes a read/write request signal output from a central processing unit (CPU) not shown. In a data read operation, the read/write request signal S11 is output as a read-out request signal set to the low level. In a data write operation, the read/write request signal S11 is output as a write-in request signal set to the high level. S12 denotes an address signal output from the CPU. DB(O) to DB(7) denote data buses respectively. 10 indicates each of the plurality of conventional memory cells (MC) placed in a memory cell array. 11 indicates a read-write control circuit having both a read-out control circuit such as a sense amplifier (SA) and a write-in control circuit (WC). The pair of bit lines BL and BL(inverted) connected to each read-write control circuit 11 are set to levels opposite to each other in the write-in control circuit (WC) according to a value of bit data transmitted through the corresponding data bus DB in response to the write-in request signal S11. Bit data corresponding to different levels of the pair of bit lines BL and BL(inverted) connected to each read-write control circuit 11 is amplified in the read-out control circuit (SA) in response to the read-out request signal S11 and is output through the corresponding data bus DB. 12 indicates an address decoder (DEC) for receiving the address signal S12, selecting one word line WL connected to the memory cells 10 placed on a row of the memory cell array according to the address signal S12 and setting the selected word line WL to the high level. The conventional RAM shown in FIG. 7 has a plurality of memory cells 10 shown in FIG. 6 as basic memory cells (or read/write memory cells).

Next, an operation of the conventional RAM will be described below.

In a data write-in operation for one memory cell 10, a address signal S12 indicating a write-in address is transmitted from the CPU to the address decoder 12, one word line WL connected to the memory cell 10, in which bit data is planned to be written, is set to the high level according to the address signal S12. Therefore, as shown in FIG. 6, the transistors T1 and T2 of the memory cell 10 are turned on, and the memory cell 10 is electrically connected to both the corresponding bit line BL and the corresponding inverted bit line BL(inverted). Also, the write-in control circuit WC of the read-write control unit 11 connected to both the bit line BL and the inverted bit line BL(inverted) is operated in response to a write-in request signal S11, bit data transmitted from the outside through the corresponding data bus DB is written in the memory cell 10 through the write-in control circuit WC of the read-write control unit 11 and the bit line BL and the inverted bit line BL(inverted). In detail, the bit line BL is set to a first bit level (high or low level) according to the bit data, the inverted bit line BL(inverted) is set to a second bit level (low or high level) according to the bit data, the input end of the inverter INV2 is equalized to the first bit level of the bit line BL through the transistor T1, the input end of the inverter INV1 is equalized to the second bit level of the inverted bit line BL(inverted) through the transistor T2.

Also, in a data read-out operation for one memory cell 10, an address signal S12 indicating a read-out address is transmitted from the CPU to the address decoder 12, one word line WL connected to the memory cell 10, from which bit data is planned to be read out, is set to the high level according to the address signal S12. Therefore, the transistors T1 and T2 of the memory cell 10 are turned on, and the memory cell 10 is electrically connected to both the corresponding bit line BL and the corresponding inverted bit line BL(inverted), the bit line BL is equalized to a level of the output end of the inverter INV1, and the inverted bit line BL(inverted) is equalized to a level of the output end of the inverter INV2. Also, the read-out control circuit SA of the read-write control unit 11 connected to both the bit line BL and the inverted bit line BL(inverted) is operated in response to a read-out request signal S11, the levels of both the bit line BL and the inverted bit line BL(inverted) are amplified in the read-out control circuit SA to produce bit data, and the bit data is output as bit data stored in the memory cell 10 to the outside through the corresponding data bus DB.

FIG. 8A is a view showing the configuration of a conventional large scale integration circuit (LSI) manufactured before the determination of preset data and/or preset program codes, and FIG. 8B is a view showing the configuration of the conventional LSI manufactured after the determination of preset data and/or preset program codes. In FIG. 8A and FIG. 8B, 14 indicates a CPU. 15 indicates a RAM. 13 indicates an LSI having the RAM 15 and the CPU 14. 16 indicates an external memory placed at the outside of the LSI 13. 17 indicates a mask type read only memory (ROM). The RAM 15 and the mask type ROM 17 are operated under the control of the CPU 14. The external memory 16 is connected to the RAM 15. The RAM 15 has the same configuration as that of the conventional RAM shown in FIG. 7.

In an LSI having a RAM and a CPU such as a logic circuit, the onboard RAM is used as a memory for storing data and/or program codes required by an onboard CPU. However, because the RAM denotes a volatile memory, when an electric power supplied to the RAM is stopped, data and/or program codes stored in the RAM are undesirably lost. Therefore, it is required to store preset data and/or preset program codes (for example, a boot program or a self-diagnosis program) required by the onboard CPU to a ROM.

Also, in cases where an apparatus using an LSI is developed for the purpose of the mass production of the apparatus, the apparatus is made many times on an experimental basis, and the performance of the apparatus is tested each time the apparatus is made. In this case, the specification of the LSI is revised each time the apparatus is made on an experimental basis, and it is required to change data and/or program codes preset in the LSI in compliance with the revision of the specification of the LSI. Assuming that preset data and/or preset program codes are stored in a mask type ROM of the LSI before the final determination of the preset data and/or the preset program codes, it is required to replace the mask type ROM with another one each time the specification of the LSI is revised, and it takes a long time and a high cost to develop the apparatus. To prevent this problem, before the final determination of the preset data and/or the preset program codes, in other words, during the test operation of the apparatus made on an experimental basis, as shown in FIG. 8A, the RAM 15 is placed in the LSI 13, and the external memory 16 connected to the RAM 15 is placed outside the LSI 13. When electric power is provided to the LSI 13, data and/or program codes stored in the external memory 16 are transferred to the RAM 15 to preset the data and/or the program codes to the RAM 15. The external memory 16 is, for example, formed of a flash memory, and data can be rewritten in both the external memory 16 and the RAM 15. Therefore, each time it is required to revise the preset data and/or the preset program codes written in the RAM 15, the preset data and/or the preset program codes stored in the external memory 16 are rewritten, and the rewritten data and/or the rewritten program codes are transferred from the external memory 16 to the RAM 15 to rewrite the preset data and/or the preset program codes stored in the RAM 15. After the preset data and/or the preset program codes are finally determined, as shown in FIG. 8B, the external memory 16 is disconnected from the LSI 13, the mask type ROM 17 is manufactured so as to store the preset data and/or the preset program codes finally determined, and the RAM 15 of the LSI 13 is replaced with the mask type ROM 17 having the preset data and/or the preset program codes finally determined.

This method of replacing the RAM 15 with the mask type ROM 17 is used in cases where the preset data and/or the preset program codes are stored in all areas of the RAM 15.

Also, in a general RAM having a plurality of memory cells, because each inverter of one memory cell is composed of two transistors, six transistors are, for example, required to store a piece of bit information in the memory cell. In contrast, only one transistor is required to store a piece of bit information in a general ROM. Therefore, a size of the mask type ROM 17 can be considerably smaller than that of the RAM 15 to store the preset data and/or the preset codes, a die size of the LSI 13 can be reduced by using the mask type ROM 17 in place of the RAM 15, and the manufacturing cost of the LSI 13 can be reduced.

Also, in cases where an LSI having a RAM and not having a mask type ROM is used, an external memory having the preset data and/or the preset program codes finally determined is necessarily required. However, no external memory is required of the LSI 13 by storing the preset data and/or the preset program codes finally determined in the mask type ROM 17. Therefore, the LSI 13 can be easily arranged in an apparatus using the LSI 13.

However, because the conventional LSI shown in FIG. 8A and FIG. 8B has the above-described configuration, the preset data and/or the preset program codes finally determined by using the RAM 15 are stored in the mask type ROM 17, and the LSI 13 is finally manufactured by replacing the RAM 15 with the mask type ROM 17. In this case, the memory performance of the mask type ROM 17 such as data read rate and consumed current differs from those of the RAM 15. Also, because the layout of elements of the LSI 13 is changed due to the replacement of the RAM 15 with the mask type ROM 17, the characteristics of the LSI 13 are changed due to the replacement of the RAM 15 with the mask type ROM 17. Therefore, a problem has arisen that it is required to again estimate the performance of the apparatus using the LSI 13 after the final determination of the preset data and/or the preset program codes.

Next, an LSI not required to again estimate the performance of an apparatus using the LSI after the final determination of the preset data and/or the preset program codes will be described below.

FIG. 9A is a view showing the configuration of another conventional LSI manufactured before the determination of preset data and/or preset program codes, and FIG. 9B is a view showing the configuration of the conventional LSI manufactured after the determination of preset data and/or preset program codes. The constituent elements, which are the same as those shown in FIG. 8A or FIG. 8B, are indicated by the same reference numerals as those of the constituent elements shown in FIG. 8A or FIG. 8B, and additional description of those constituent elements is omitted. In the conventional LSI 13 shown in FIG. 9A, the mask type ROM 17 not yet having data or program codes is arranged with the RAM 15. When a switch is set to a first position, the RAM 15 is connected to the external memory 16 through the switch. Also, when the switch is set to a second position, the RAM 15 is disconnected from the external memory 16 but is connected to the ROM 17 through the switch.

Before the final determination of the preset data and/or the preset program codes, in other words, during the test operation of the apparatus made on an experimental basis, in the same manner as the LSI shown in FIG. 8A, the switch is set to the first position, and data and/or program codes stored in the external memory 16 are transferred to the RAM 15 to store preset data and/or-preset program codes to the RAM 15 when electric power is provided to the LSI 13. After the preset data and/or the preset program codes are finally determined, a wiring operation is performed for the mask type ROM 17 of the LSI 13 to write the preset data and/or the preset program codes finally determined in the mask type ROM 17, the switch is changed to the second position to disconnect the external memory 16 from the RAM 15, and the external memory 16 is removed. Therefore, the conventional LSI shown in FIG. 9B is obtained.

This method of arranging both the RAM 15 and the mask type ROM 17 in the LSI 13 is used in cases where pieces of data stored in all areas of the RAM 15 are not replaced with those of the mask type ROM 17. For example, in case of the RAM 15 having a memory capacity of 1.024 MB, the preset data and/or the preset program codes finally determined are stored in an area of 512 KB in the RAM 15, and pieces of data are written in or read out from an area of the other 512 KB in the RAM 15 during the operation of the LSI 13. Therefore, the function of the RAM 15 can be used in the LSI 13.

In the conventional LSI 13 shown in FIG. 9B, when the CPU 14 requires the preset data and/or the preset program codes finally determined, the preset data and/or the preset program codes stored in the mask type ROM 17 are transferred to the CPU 14 through the RAM 15. Therefore, the memory performance of the RAM 15 for the CPU 14 after the final determination of the preset data and/or the preset program codes is substantially the same as that before the final determination of the preset data and/or the preset program codes, and the layout of elements of the LSI 13 is not changed. Therefore, it is not required to again estimate the performance of the apparatus using the LSI 13 after the final determination of the preset data and/or the preset program codes.

However, because the conventional LSI shown in FIG. 9 has the above-described configuration, the mask type ROM 17 is arranged in the LSI 13 only to transfer the preset data and/or the preset program codes to the RAM 15. Therefore, another problem has arisen that the die size of the LSI 13 is enlarged, and the manufacturing cost of the LSI 13 is increased.

Also, the manufacturing cost of the mask type ROM 17 required to store the preset data and/or the preset program codes is high, investment in plant and equipment for the manufacturing of the mask type ROM 17 is high, and it takes a lot of time to manufacture the mask type ROM 17. Therefore, another problem has arisen that the manufacturing of a large number of mask type ROMs is required to reduce the manufacturing cost of each mask type ROM.

Another prior art will be described below.

A memory cell array and a semiconductor memory are disclosed in Published Unexamined Japanese Patent Application No. H05-314776 (1993). In this memory cell array of the semiconductor device, a part of a memory cell array is formed to memory cells having an unwritable fixed storage value to reduce an occupancy area of both a RAM and a ROM related to a semiconductor memory. However, because no inverter is used in the memory cell having an unwritable fixed storage value, the memory characteristics such as a data read-out time in the memory cell having an unwritable fixed storage value differs from those in the memory cell having a writable storage value. Therefore, even though the preset data and/or the preset program codes are determined by using the semiconductor memory having only the memory cells of writable storage values, it is required to again estimate the memory characteristics of the semiconductor memory having the memory cells of writable storage values and the memory cells of unwritable fixed storage values.

SUMMARY OF THE INVENTION

A main object of the present invention is to provide, with due consideration to the drawbacks of the conventional semiconductor memory, a semiconductor memory and a semiconductor memory writing-in control device in which the increase of a die size is prevented without changing characteristics of the semiconductor memory after the determination of preset data or a preset program code.

A subordinate object is also achieved by the provision of a semiconductor memory and a semiconductor memory writing-in control device in which the increase of a consumed current is prevented in the writing of data in the semiconductor memory.

A semiconductor memory includes a storage value fixing memory cell having a first inverter, a second inverter, a first transistor and a second transistor. An input end of the first inverter is connected to a low electric potential terminal or is connected to a high electric potential terminal. An input end of the second inverter is set to a level opposite to that of the input end of the first inverter. The first transistor is turned on according to a first word level of a word line to set a first bit line to a first bit level opposite to a level of the input end of the first inverter. The second transistor is turned on according to the first level of the word line to set a second bit line to a second bit level opposite to a level of the input end of the second inverter.

Therefore, characteristics of the semiconductor memory are not changed even though a read/write memory cell of the semiconductor memory is changed to the storage value fixing memory cell after the determination of preset data or a preset program code to store the preset data or the preset program code in the storage value fixing memory cell. Accordingly, the increase of a die size of the semiconductor memory can be prevented without changing characteristics of the semiconductor memory after the determination of the preset data or the preset program code.

DETAILED DESCRIPTION OF THE PREFERRED EMBODIMENTS

Embodiments of the present invention will now be described with reference to the accompanying drawings.
Embodiment 1

Figure 1A:
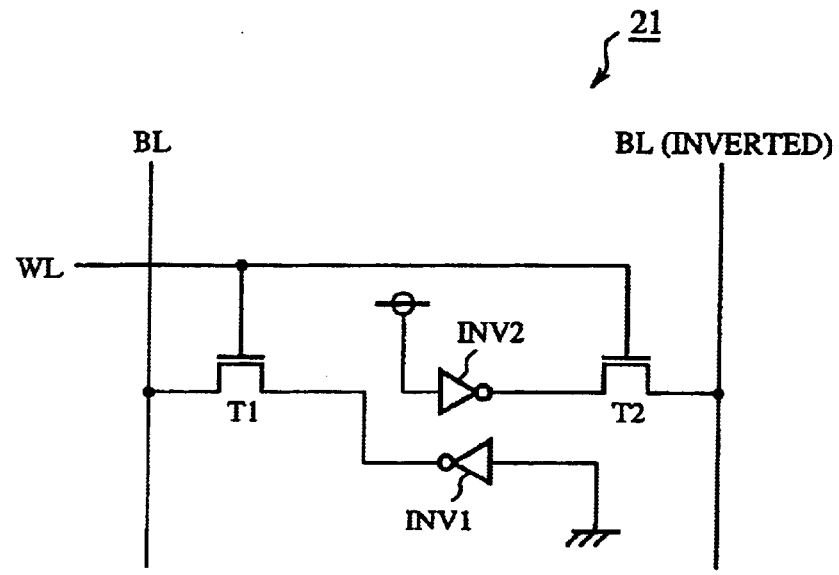
FIG. 1A is a view showing the configuration of a memory cell, which stores fixed bit data of "1", according to a first embodiment of the present invention.
Figure 1B:
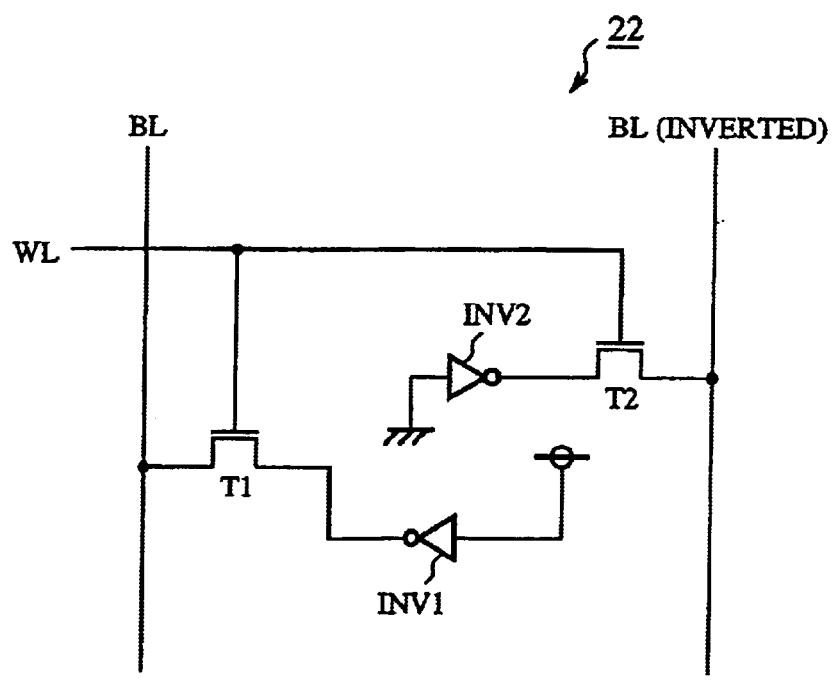
FIG. 1B is a view showing the configuration of another memory cell, which stores fixed bit data of "0", according to the first embodiment of the present invention.

FIG. 1A is a view showing the configuration of a memory cell, which stores fixed bit data of "1", according to a first embodiment of the present invention, and FIG. 1B is a view showing the configuration of another memory cell, which stores fixed bit data of "0", according to the first embodiment of the present invention. The constituent elements, which are the same as those shown in FIG. 6, are indicated by the same reference numerals as those of the constituent elements shown in FIG. 6, and additional description of those constituent elements is omitted.

In FIG. 1A and FIG. 1B, 21 indicates a memory cell (or a storage value fixing memory cell) having the transistor (or a first transistor) T1, the transistor (or a second transistor) T2, the inverter (or a first inverter) INV1 and the inverter (or a second inverter) INV2. 22 indicates another memory cell (or a storage value fixing memory cell) having the transistors T1 and T2 and the inverters INV1 and INV2.

Figure 6:
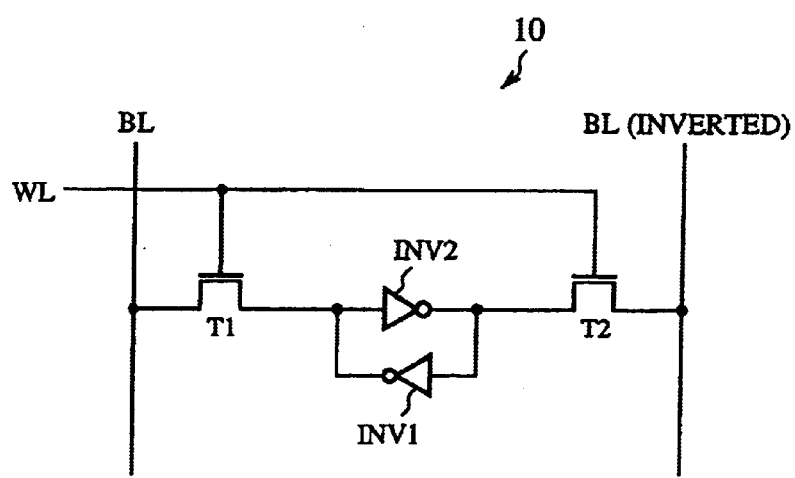
FIG. 6 is a view showing the configuration of a conventional memory cell.

In a first embodiment, a static random access memory (SRAM) representing a semiconductor memory has a memory cell array composed of a plurality of memory cells 21, a plurality of memory cells 22 and a plurality of memory cells (or read/write memory cells) 10 shown in FIG. 6, and each memory cell has six transistors. The SRAM except the memory cell array has the same configuration as that of the RAM shown in FIG. 7. Therefore, an address decoder of the SRAM functions in the same manner as the address decoder 12, and a read-write control unit of the SRAM functions in the same manner as the read-write control unit 11.

The manufacturing of the memory cells 21 and 22 will be described below.

All memory cells of the SRAM are initially formed in a plurality of memory cells having the same configuration as that of the memory cell 10 shown in FIG. 6 in a metal wiring process of the LSI manufacturing. Thereafter, data and/or program codes to be preset in an LSI having both the SRAM and a CPU are finally determined by using the SRAM having only the memory cells 10. After the determination of the preset data and/or the preset program codes is completed, a plurality of specific memory cells planned to store bit data of "1" and a plurality of specific memory cells planned to store bit data of "0" are selected from the memory cells 10 of the SRAM to store the preset data and/or the preset program codes in an area of the specific memory cells. That is, the specific memory cells are selected so as to function as those of a ROM.

Thereafter, the metal wiring process of the LSI manufacturing is again performed in each specific memory cell planned to store bit data of "1". In detail, as shown in FIG. 1A, the input end of the inverter INV1 is disconnected from a connection point between the transistor T2 and the output end of the inverter INV2, the input end of the inverter INV2 is disconnected from a connection point between the transistor T1 and the output end of the inverter INV1, the input end of the inverter INV1 is connected to a low electric potential terminal or is connected to a low electric potential terminal, and the input end of the inverter INV2 is connected to a high electric potential terminal. Here, the output end of the inverter INV1 is connected to the transistor T1, and the output end of the inverter INV2 is connected to the transistor T2. Therefore, the specific memory cells having the same configuration as that of the memory cell 10 shown in FIG. 6 is changed to the memory cells 21.

Also, the metal wiring process of the LSI manufacturing is again performed in each specific memory cell planned to store bit data of "0". In detail, as shown in FIG. 1B, the input end of the inverter INV1 is disconnected from a connection point between the transistor T2 and the output end of the inverter INV2, the input end of the inverter INV2 is disconnected from a connection point between the transistor T1 and the output end of the inverter INV1, the input end of the inverter INV1 is connected to the high electric potential terminal, and the input end of the inverter INV2 is connected to the low electric potential terminal. Here, the output end of the inverter INV1 is connected to the transistor T1, and the output end of the inverter INV2 is connected to the transistor T2. Therefore, the specific memory cells having the same configuration as that of the memory cell 10 shown in FIG. 6 is changed to the memory cells 22.

Also, the other memory cells not selected are used as the memory cells 10 having the same configuration as that shown in FIG. 6.

In the above configuration of the memory cells 21 and 22 of the SRAM, an operation of each memory cell 21 and an operation of each memory cell 22 will be described below.

In the memory cell 21 shown in FIG. 1A, when the transistors T1 and T2 are turned on in response to the high level (or first word level) of the word line WL in a data read operation, the bit line BL (or a first bit line) is always set to the high level due to the high level of the output end of the inverter INV1, the inverted bit line BL(inverted) (or a second bit line) is always set to the low level due to the low level of the output end of the inverter INV2. Therefore, the memory cell 21 shown in FIG. 1A functions as a memory cell storing the fixed bit data of "1" as if the memory cell 21 is placed in a ROM.

Also, in the memory cell 22 shown in FIG. 1B, when the transistors T1 and T2 are turned on in a data read operation, the bit line BL is always set to the low level due to the low level of the output end of the inverter INV1, the inverted bit line BL(inverted) is always set to the high level due to the high level of the output end of the inverter INV2. Therefore, the memory cell 22 shown in FIG. 1B functions as a memory cell storing the fixed bit data of "0" as if the memory cell 22 is placed in a ROM.

In contrast, in each of the non-selected memory cells 10 having the same configuration as that shown in FIG. 6, variable bit data stored in the memory cell 10 is output to the outside through the bit line BL and the inverted bit line BL(inverted) in a data read operation. Also, in a data write operation, bit data transmitted from the outside is stored in the memory cell 10 through the bit line BL and the inverted bit line BL(inverted).

Here, the fixed bit data stored in the memory cell 21 or 22 is read out through the inverter INV1 or INV2 in the same manner as the variable bit data read out from the memory cell 10 through the inverter INV1 or INV2. Therefore, the ability of each memory cell 21 shown in FIG. 1A and the ability of each memory cell 22 shown in FIG. 1B to activate the bit line BL or the inverted bit line (inverted) is the same as that of the non-selected memory cell 10 having the same configuration as that shown in FIG. 6. The bit line activating ability of the memory cell denotes the current driving ability of the memory cell and denotes a factor for determining a data read-out time period from the turning-on of the transistors to the arrival of the bit data of the memory cell at a sense amplifier SA (not shown). Therefore, the memory characteristics of the SRAM having the memory cells 10, 21 and 22 are the same as those of the SRAM having only the memory cells 10.

Figure 9A:
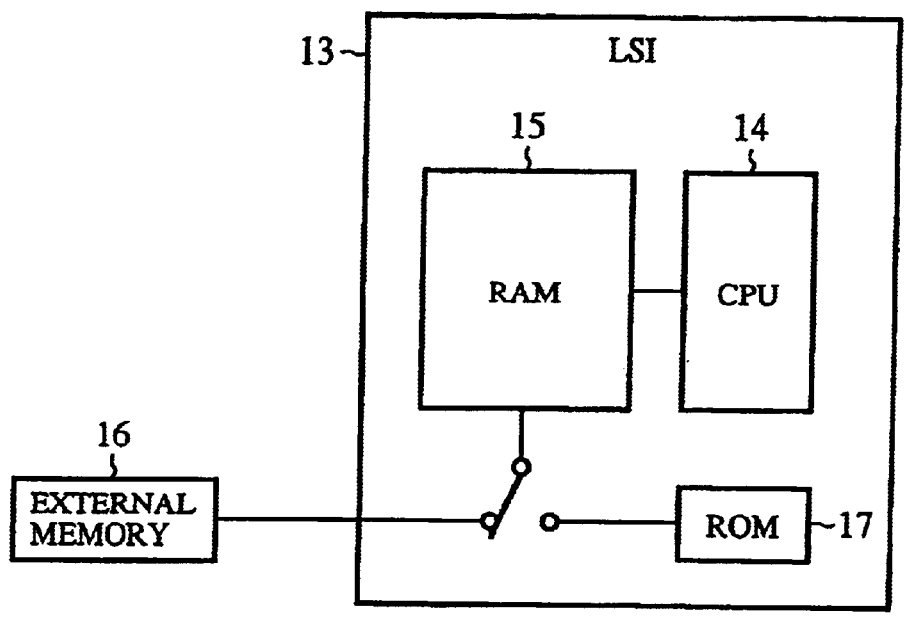
FIG. 9A is a view showing the configuration of another conventional LSI manufactured before the determination of preset data and/or preset program codes.
Figure 9B:
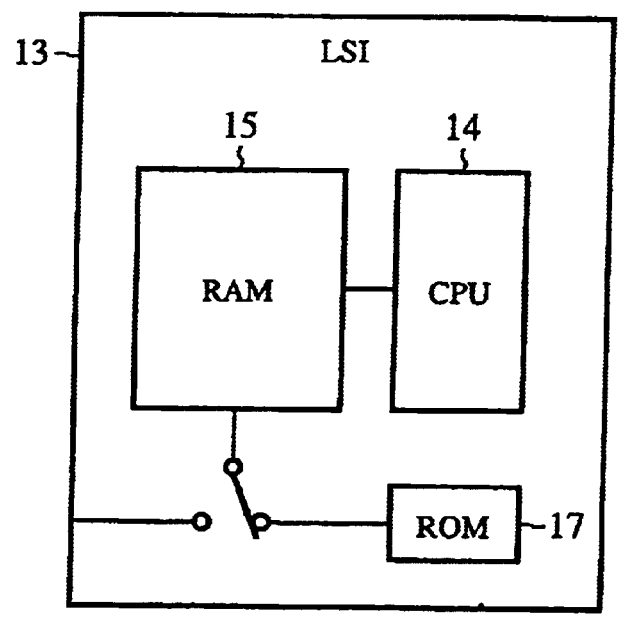
FIG. 9B is a view showing the configuration of the conventional LSI manufactured after the determination of preset data and/or preset program codes.

As is described above, in the first embodiment, a plurality of specific memory cells are selected from the all memory cells 10 of the SRAM in a metal wiring process of the LSI manufacturing to store the preset data and/or the preset program codes in an area of the specific memory cells. In each specific memory cell, the input end of one inverter is disconnected from the output end of the other inverter and is connected to the low electric potential terminal while connecting the output end of the one inverter to one transistor, the input end of the other inverter is disconnected from the output end of the one inverter and is connected to the high electric potential terminal while connecting the output end of the other inverter to the other transistor. Therefore, the specific memory cells can be changed to the memory cells 21 and 22 functioning as those of a ROM, and the preset data and/or the preset program codes can be stored in the memory cells 21 and 22. That is, an area of the memory cells 21 and 22 of the SRAM is used as a ROM. Accordingly, as compared with the conventional LSI shown in FIG. 9, because no mask type ROM placed with the SRAM is additionally required to store the preset data and/or the preset program codes, the die size of the LSI can be reduced, and the manufacturing cost of the LSI can be reduced.

Figure 8A:
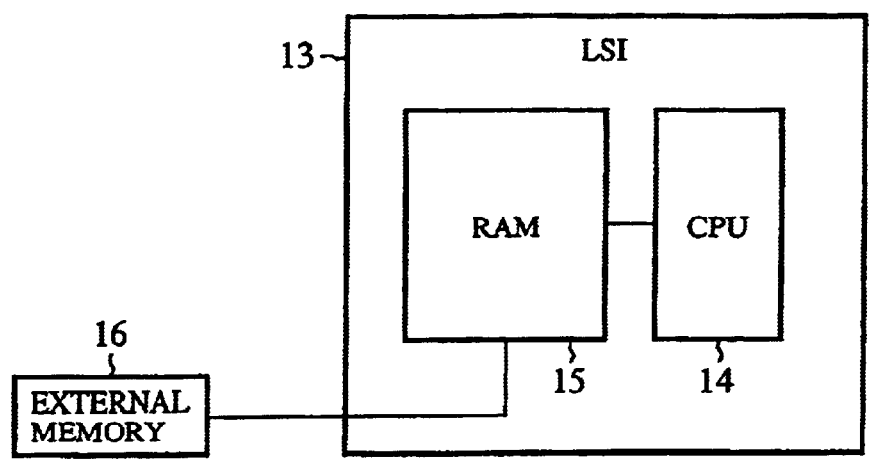
FIG. 8A is a view showing the configuration of a conventional LSI manufactured before the determination of preset data and/or program codes.
Figure 8B:
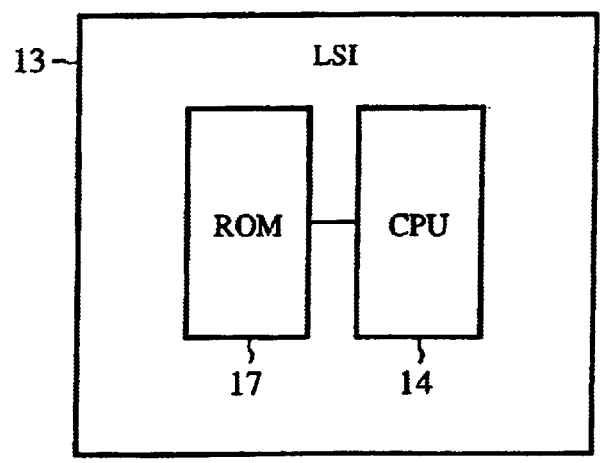
FIG. 8B is a view showing the configuration of the conventional LSI manufactured after the determination of preset data and/or program codes.

Also, as compared with the conventional LSI shown in FIG. 8A and FIG. 8B, because the SRAM with the memory cells 21 and 22 functioning as those of a ROM is not replaced with any ROM to store the preset data and/or the preset program codes in the ROM, the memory characteristics of the LSI such as data read rate and consumed current are not changed after the final determination of the preset data and/or the preset program codes. Also, because the layout of elements of the LSI is not changed, the characteristics of the LSI are maintained after the final determination of the preset data and/or the preset program codes. Therefore, it is not required to estimate the performance of an apparatus using the LSI after the final determination of the preset data and/or the preset program codes. Accordingly, the manufacturing time and the manufacturing cost of the LSI can be reduced.

Also, as compared with the Published Unexamined Japanese Patent Application No. H05-314776 (1993), even though a part of the memory cells 10 of the SRAM used for the determination of the preset data and/or the preset program codes is changed to the memory cells 21 and 22, the memory characteristics of the LSI is not changed. Therefore, it is not required to estimate the performance of an apparatus using the LSI after the final determination of the preset data and/or the preset program codes. Accordingly, the manufacturing time and the manufacturing cost of the LSI can be reduced.

Embodiment 2

In the first embodiment, when it is tried to write bit data of "0" in the memory cell 21 or it is tried to write bit data of "1" in the memory cell 22 in a data write operation, there is a problem that current is consumed in vain in the memory cell 21 or 22 during the data write operation.

Figure 2:
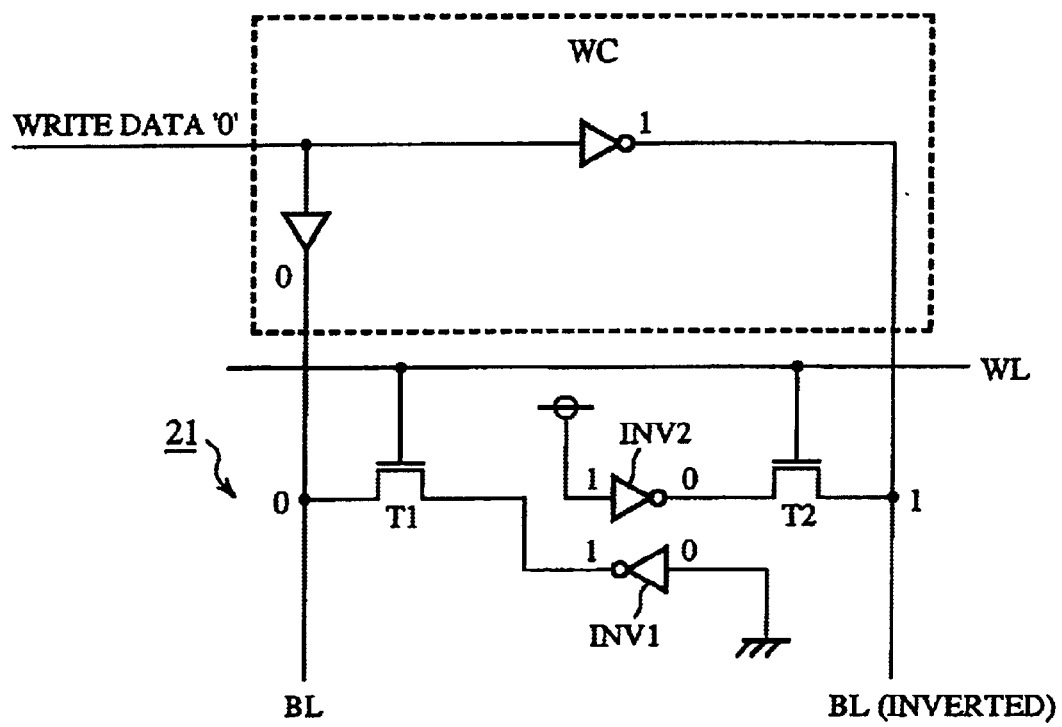
FIG. 2 is a view showing a data write operation performed in the memory cell shown in FIG. 1A.

A data write operation of trying the writing of bit data of "0" in the memory cell 21 will be described with reference to FIG. 2 as an example.

In the LSI including both the SRAM and the CPU (not shown), a write-in control program (or read/write control program) is executed in the CPU to produce a write-in request signal. Because the write-in control program is not revised even though a part of the memory cells 10 of the SRAM is changed to the memory cells 21 and 22 functioning as those of a ROM, there is a case where a write operation of write data differing from the fixed bit data stored in one memory cell 21 or 22 is performed for the memory cell 21 or 22. For example, the transistors T1 and T2 of one memory cell 21 are turned on due to the word line WL set to the high level according to the address signal S12 (refer to FIG. 7), and write data of "0" is transmitted to the memory cell 21 through a write-in control circuit WC of a read-write control unit according to a write-in request signal (refer to FIG. 7). In this case, as shown in FIG. 2, because the write data of "0" differs from the fixed bit data of "1" stored in the memory cell 21, the bit line BL is set to the low level 0 which differs from the high level 1 of a line between the transistor T1 and the output end of the inverter INV1, and the inverted bit line BL(inverted) is set to the high level 1 which differs from the low level 0 of a line between the transistor T2 and the output end of the inverter INV2. Because the output end of each inverter is fixedly set to the high level 1 or the low level 0, both current flowing from the inverter INV1 to the bit line BL and current flowing from the inverted bit line BL(inverted) to the inverter INV2 are consumed in vain during the data write operation. Also, there is a case where current is consumed in vain in the memory cell 22 in the same manner as in the memory cell 21.

To reduce the current consumed in vain in the memory cells 21 and 22, the configuration of each memory cell 21 and the configuration of each memory cell 22 are changed according to a second embodiment.

Figure 3A:
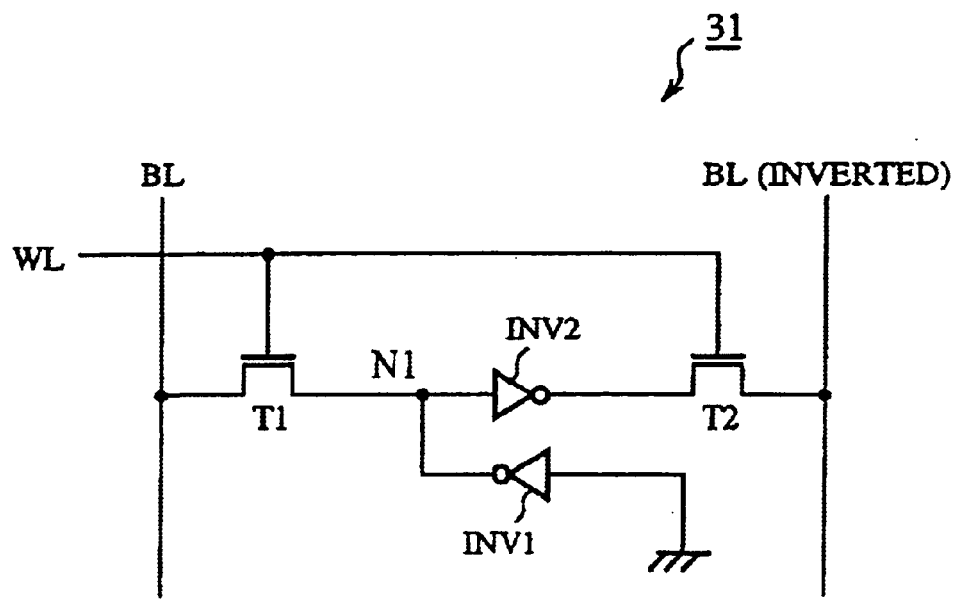
FIG. 3A is a view showing the configuration of a memory cell, which stores fixed bit data of "1", according to a second embodiment of the present invention.
Figure 3B:
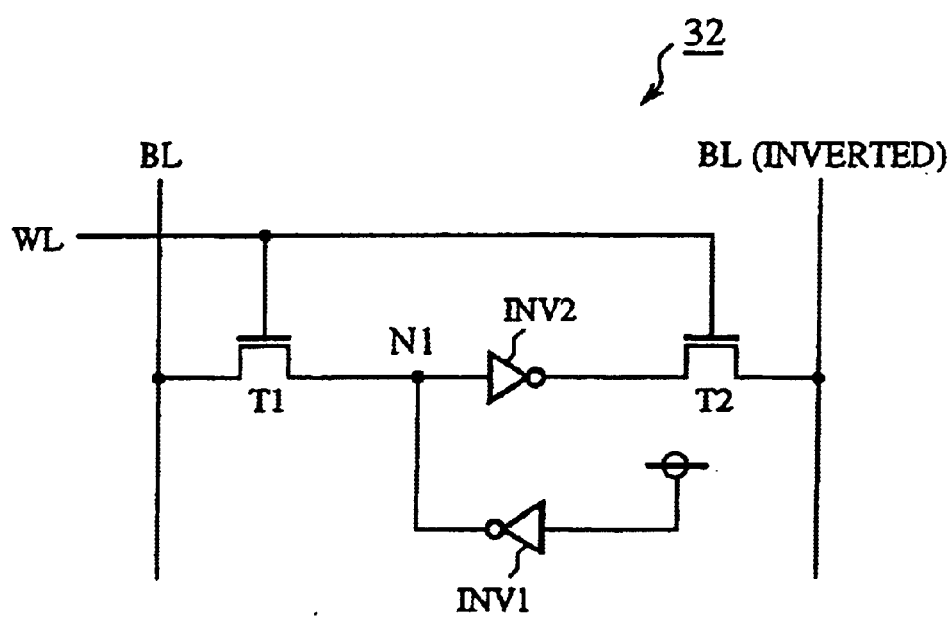
FIG. 3B is a view showing the configuration of another memory cell, which stores fixed bit data of "0", according to the second embodiment of the present invention.

FIG. 3A is a view showing the configuration of a memory cell, which stores fixed bit data of "1", according to a second embodiment of the present invention, and FIG. 3B is a view showing the configuration of another memory cell, which stores fixed bit data of "0", according to the second embodiment of the present invention. The constituent elements, which are the same as those shown in FIG. 1A or FIG. 1B, are indicated by the same reference numerals as those of the constituent elements shown in FIG. 1A or FIG. 1B, and additional description of those constituent elements is omitted.

In FIG. 3A and FIG. 3B, 31 indicates a memory cell (or storage value fixing memory cell) having node N1 the transistors T1 and T2 and the inverters INV1 and INV2. 32 indicates another memory cell (or storage value fixing memory cell) having node N1, the transistors T1 and T2 and the inverters INV1 and INV2.

The manufacturing of the memory cells 31 and 32 will be described below.

The metal wiring process of the LSI manufacturing is again performed in each specific memory cell planned to store fixed bit data of "1". In detail, as shown in FIG. 3A, in the specific memory cell having the same configuration as the memory cell 10 shown in FIG. 6, the input end of the inverter INV1 is disconnected from a connection point between the transistor T2 and the output end of the inverter INV2, and the input end of the inverter INV1 is connected to the low electric potential terminal. Here, the output end of the inverter INV1 is connected to the transistor T1 via node Ni, and the output end of the inverter INV2 is connected to the transistor T2. Therefore, the specific memory cells having the same configuration as the memory cell 10 shown in FIG. 6 is changed to the memory cells 31.

Also, the metal wiring process of the LSI manufacturing is again performed in each specific memory cell planned to store fixed bit data of "0". In detail, as shown in FIG. 3B, in the specific memory cell having the same configuration as the memory cell 10 shown in FIG. 6, the input end of the inverter INV1 is disconnected from a connection point between the transistor T2 and the output end of the inverter INV2, and the input end of the inverter INV1 is connected to the high electric potential terminal. Here, the output end of the inverter INV1 is connected to the transistor T1 via node N1, and the output end of the inverter INV2 is connected to the transistor T2. Therefore, the specific memory cells having the same configuration as the memory cell 10 shown in FIG. 6 is changed to the memory cells 32.

In the memory cell 31, both the output end of the inverter INV1 and the input end of the inverter INV2 are always set to the high level, and the output end of the inverter INV2 is set to the low level. Therefore, in a data read operation, the memory cell 31 functions as a memory cell of a ROM which stores the fixed bit data of "1". Also, in the memory cell 32, both the output end of the inverter INV1 and the input end of the inverter INV2 are always set to the low level, and the output end of the inverter INV2 is set to the high level. Therefore, in a data read operation, the memory cell 31 functions as a memory cell of a ROM which stores the fixed bit data of "0".

When write data of "0" is transmitted to the memory cell 31 in a data write operation, the bit line BL is set to the low level, and the inverted bit line BL(inverted) is set to the high level. In this case, though current flowing from the inverter INV1 to the bit line BL is consumed in vain so as to set a line between the transistor T1 and the input end of the inverter INV2 to the low level, the output end of the inverter INV2 is easily set to the high level. Therefore, only current flowing the inverter INV1 to the bit line BL is consumed in vain during the data write operation.

Also, when write data of "1" is transmitted to the memory cell 32 in a data write operation, the bit line BL is set to the high level, and the inverted bit line BL(inverted) is set to the low level. In this case, though current flowing from the bit line BL to the inverter INV1 is consumed in vain so as to set a line between the transistor T1 and the input end of the inverter INV2 to the high level, the output end of the inverter INV2 is easily set to the low level. Therefore, only current flowing from the bit line BL to the inverter INV1 is consumed in vain during the data write operation.

As is described above, in the second embodiment, a plurality of specific memory cells are selected from the all memory cells 10 of the SRAM in a metal wiring process of the LSI manufacturing to store the preset data and/or the preset program codes in the specific memory cells. In each specific memory cell, the input end of one inverter is disconnected from the output end of the other inverter and is connected to the high electric potential terminal or is connected to the low electric potential terminal. Therefore, the preset data and/or the preset program codes can be stored in the memory cells 31 and 32 functioning as those of a ROM in the same manner as in the first embodiment, and the same effects as in the first embodiment can be obtained.

Also, as compared with the memory cells 21 and 22 of the first embodiment, the current consumed in vain in the memory cells 31 and 32 can be reduced to half in the data write operation.

Embodiment 3

In the first and second embodiment, the write-in control program executed by the CPU is not revised even though a part of the memory cells 10 of the SRAM is changed to the memory cells 21 and 22 or the memory cells 31 and 32. In contrast, in a third embodiment, the write-in control program is revised not to perform the data write operation for the memory cells 21 and 22 or the memory cells 31 and 32.

Figure 4:
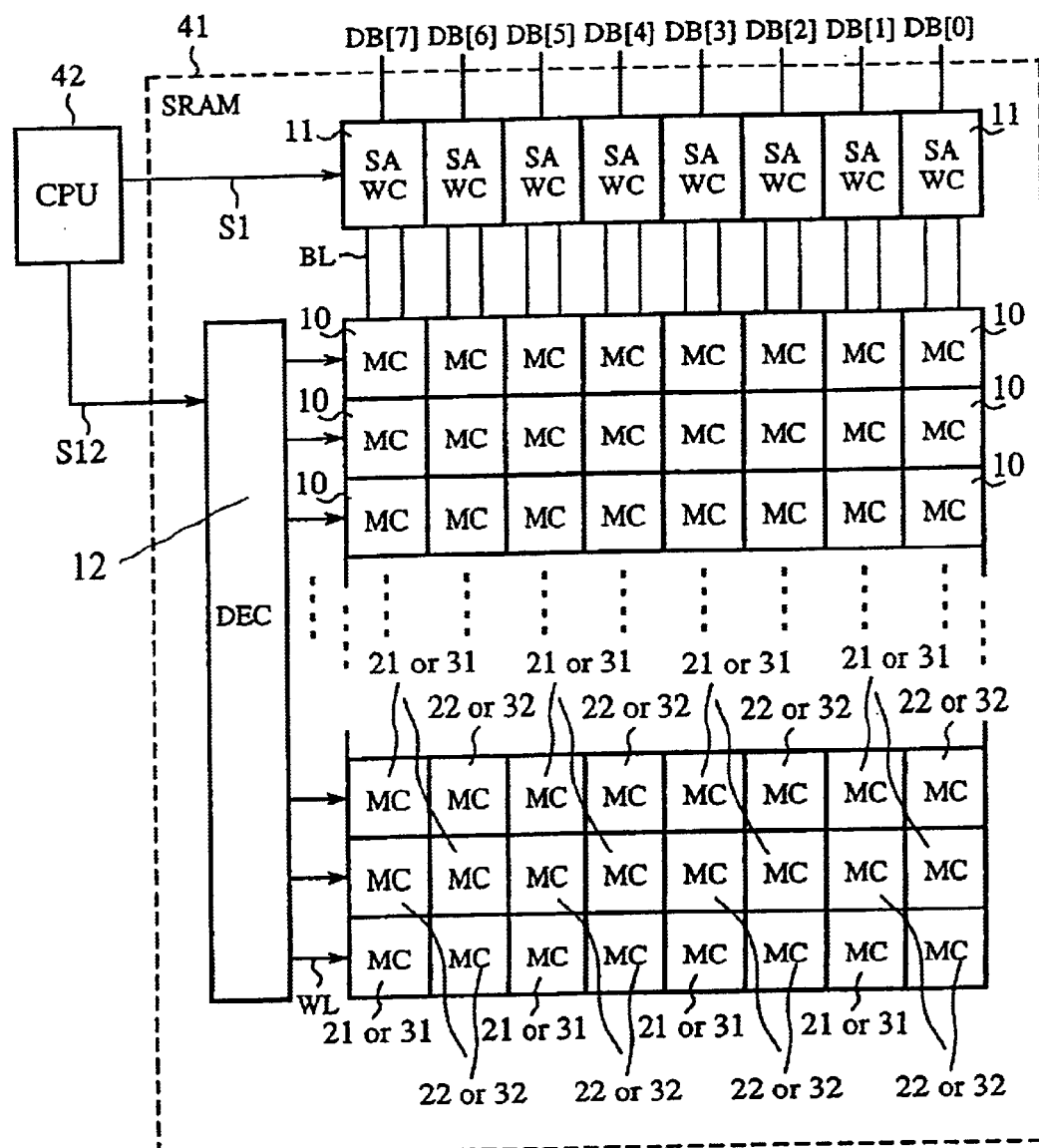
FIG. 4 is a view showing the configuration of a semiconductor memory writing-in control device having both a CPU and an SRAM according to a third embodiment of the present invention.
Figure 7:
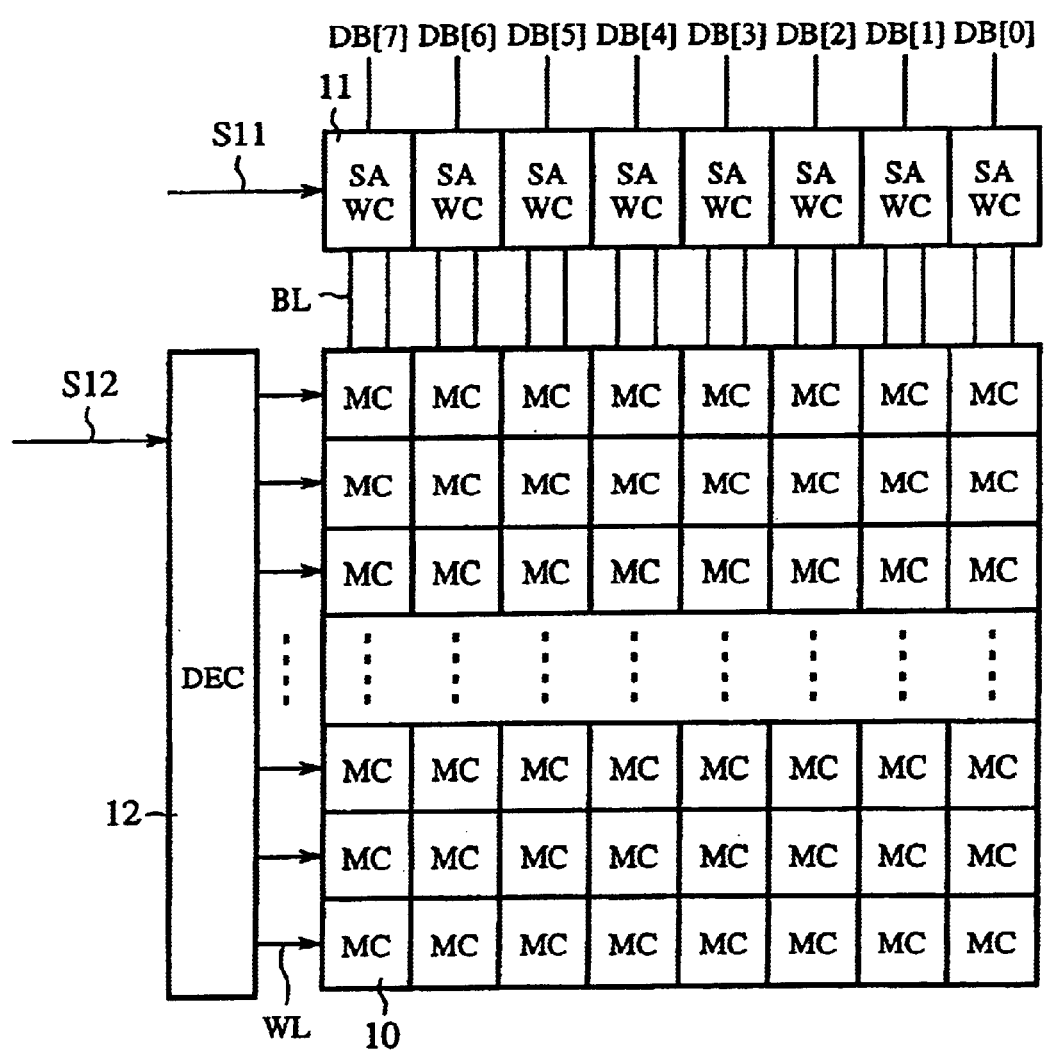
FIG. 7 is a view showing the configuration of a conventional RAM.

FIG. 4 is a view showing the configuration of a semiconductor memory writing-in control device having both a CPU and an SRAM according to a third embodiment of the present invention. The constituent elements, which are the same as those shown in FIG. 7, are indicated by the same reference numerals as those of the constituent elements shown in FIG. 7, and additional description of those constituent elements is omitted.

In FIG. 4, 41 indicates an SRAM having a memory cell array composed of the memory cells 10, 21 and 22 or the memory cells 10, 31 and 32. 42 indicates a CPU for outputting a write-in request signal S1 set to the high level according to a revised write-in control program and outputting the address signal S12. 12 indicates the address decoder (or a write-in control unit).

In the third embodiment, the write-in control program executed by the CPU 42 is revised not to perform the data write operation for the memory cells 21 and 22 or the memory cells 31 and 32 but to perform the data write operation for the memory cells 10. Therefore, in a case of the data write operation for the SRAM 41, bit data is written in each of the memory cells 10 according to both the write-in request signal S1 and the address signal S12 produced in the CPU 42. However, even though the transistors T1 and T2 of one memory cell 21, 22, 31 or 32 are turned on due to the address signal S12 of the word line WL, because no write-in request signal is sent from the CPU 42 to the write-in control circuit (WC) of the read-write control unit 11 according to the revised write-in control program, no data write operation is performed for the memory cell 21, 22, 31 or 32. In detail, the bit line BL connected to the memory cell 21, 22, 31 or 32 is merely set to the level opposite to that of the input end of the inverter INV1 of the memory cell 21, 22, 31 or 32 through the transistor T1 turned on, and the inverted bit line BL(inverted) connected to the memory cell 21, 22, 31 or 32 is merely set to the level opposite to that of the input end of the inverter INV2 of the memory cell 21, 22, 31 or 32 through the transistor T2 turned on.

As is described above, in the third embodiment, the write-in control program is revised not to perform the data write operation for the memory cells 21 and 22 or the memory cells 31 and 32. Therefore, there is no case where current is consumed in vain in the memory cells 21 and 22 or the memory cells 31 and 32 during the data write operation. Accordingly, the increase of current consumed in the memory cells 21 and 22 or the memory cells 31 and 32 of the SRAM 41 representing the semiconductor memory can be prevented in the data write operation.

Embodiment 4

In the first, second and third embodiments, the address decoder 12 shown in FIG. 4 is used in the SRAM 41 to set one word line WL selected from the all word lines to the high level and to turn on the transistors T1 and T2 connected to the selected word line WL of the high level. In contrast, in a fourth embodiment, another address decoder is used in the SRAM 41 to set the transistors T1 and T2 of the memory cells 21 and 22 or the memory cells 31 and 32 in the turn-off state in the data write operation.

Figure 5:
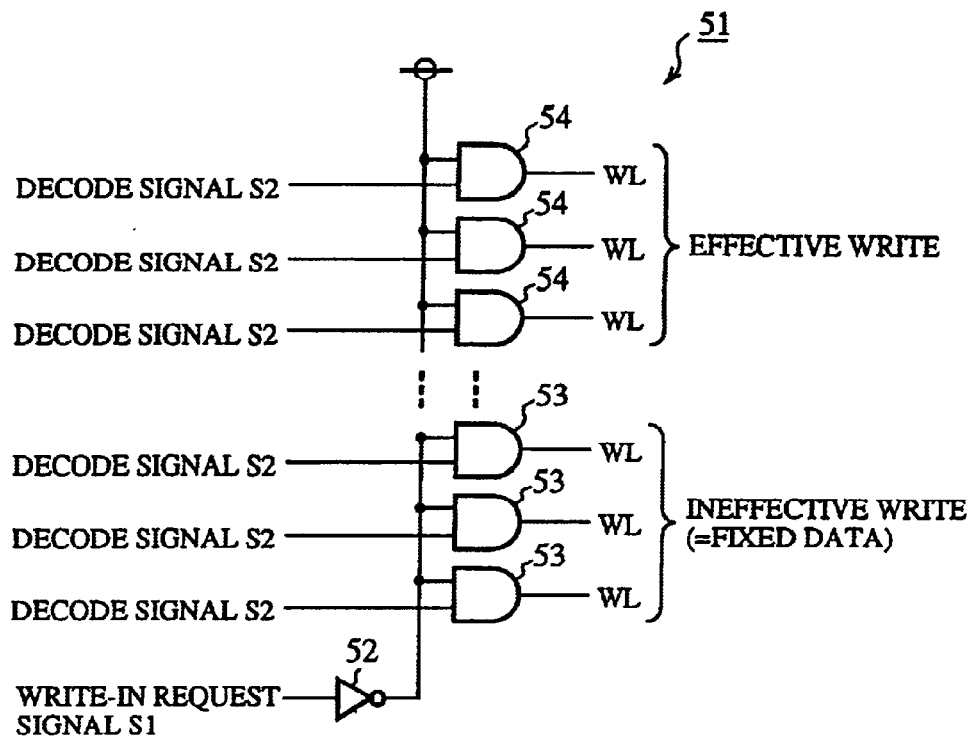
FIG. 5 is a view of an address decoder of an SRAM according to a fourth embodiment of the present invention.

FIG. 5 is a view of an address decoder of the SRAM according to a fourth embodiment of the present invention. In FIG. 5, 51 indicates an address decoder. The address decoder 51 is arranged in the SRAM 41 shown in FIG. 4 in place of the address decoder 12. 52 indicates an inverter for inverting the write-in request signal S1 of the high level to an inverted write-in request signal S1 of the low level in case of the data write operation and inverting the read-out request signal S1 of the low level to an inverted read-out request signal S1 of the high level in case of the data read operation. 53 indicates a first AND gate for receiving a decode signal S2 and the inverted write-in request signal S1 or the inverted read-out request signal S1, outputting a non-write signal of the low level in the data write operation and outputting either a read signal of the high level or a non-read signal of the low level in the data read operation. 54 indicates a second AND gate for receiving a decode signal S2 and a high level fixed signal of the high level, outputting either a write signal of the high level or a non-write signal of the low level in the data write operation and outputting either a read signal of the high level or a non-read signal of the low level in the data read operation.

As shown in FIG. 4, in the memory cell array of the SRAM 41, the memory cells 21 and 22 or the memory cells 31 and 32 are arranged in one row or more, and no memory cell 10 is arranged in the row(s). Also, the memory cells 10 are arranged in the other rows, and no memory cell 21, 22, 31 or 32 is arranged in the other rows. Each AND gate 53 is connected to one word line WL connected to the memory cells 21 and 22 or the memory cells 31 and 32, and each AND gate 54 is connected to one word line WL connected to the memory cells 10. Also, the write-in control program prepared for the SRAM having only the memory cells 10 is used in the CPU 42.

An operation of the address decoder 51 will be described below.

One of the decode signals S2 is set to the high level according to the address signal S12, and the other decode signals S2 are set to the low level. In the data read operation, the inverted write-in request signal S1 of the high level is input to the AND gates 53, and the high level fixed signal is input to the AND gates 54. Therefore, the read signal of the high level is output from the AND gate 53 or 54 corresponding to the decode signal S2 of the high level, and the transistors T1 and T2 of the memory cells 10 or the memory cells 21 and 22 (or the memory cells 31 and 32) placed in one row of the memory cell array are turned on to perform the read operation for the memory cells.

In contrast, in the data write operation, the inverted write-in request signal S1 of the low level is input to the AND gates 53, and the high level fixed signal is input to the AND gates 54. Therefore, the non-write signal of the low level is always output from each AND gate 53 regardless of the level of the decode signal S2, and the transistors T1 and T2 of the memory cells 21 and 22 (or the memory cells 31 and 32) placed in the row(s) of the memory cell array are always set to the turn-off state. Also, in cases where the decode signal S2 of the high level is received in one AND gate 54, the write signal of the high level is output from the AND gate 54 to the transistors T1 and T2 of the memory cells 10 of one row of the memory cell array to perform the write operation for the memory cells 10.

Therefore, in the data write operation, because the word lines WL connected to the memory cells 21 and 22 (or the memory cells 31 and 32) are always set to the low level to set the transistors T1 and T2 of the memory cells to the turn-off state, the memory cells 21 and 22 (or the memory cells 31 and 32) are always set to the write ineffective state, and the memory cells 10 are set to the write effective state.

As is described above, in the fourth embodiment, because the word lines WL connected to the memory cells 21 and 22 (or the memory cells 31 and 32) are always set to the low level to set the transistors T1 and T2 of the memory cells to the turn-off state, no current is consumed in vain in the data write operation in the memory cells 21 and 22 (or the memory cells 31 and 32). Accordingly, the increase of current consumed in the memory cells 21 and 22 or the memory cells 31 and 32 of the SRAM 41 representing the semiconductor memory can be prevented in the data write operation.

Embodiment 5

A manufacturing method of the SRAM 41 representing the semiconductor memory comprises the steps of manufacturing the memory cell 10 by connecting the gates of the transistors T1 and T2 to one word line WL, connecting the output ends of the inverters INV1 and INV2 cross-connected to each other to one ends of the transistors T1 and T2 respectively and connecting the other ends of the transistors T1 and T2 to the bit line BL and the inverted bit line BL(inverted) respectively, preparing the plurality of memory cells 10, selecting a plurality of specific memory cells from the memory cells 10 to store preset data and/or preset program codes finally determined in the specific memory cells, disconnecting the inverters INV1 and INV2 from each other, grounding the input end of at least one inverter INV1 in each of the specific memory cells planned to store fixed bit data of "1", and connecting the input end of at least one inverter INV1 to a high electric potential terminal in each of the specific memory cells planned to store fixed bit data of "0".

What is claimed is:

1. A semiconductor memory comprising:
   a storage value fixing memory cell from which bit data is read out in a data read operation; and
   a plurality of read/write memory cells from which bit data is read out in the data read operation in a case where no bit data is read out from the storage value fixing memory cell in the data read operation and in which bit data is written in a data write operation, wherein the storage value fixing memory cell comprises
   a first inverter of which an input end is connected to one of a low electric potential terminal and a high electric potential terminal;
   a second inverter of which an input end a) is set to a level opposite to that of the input end of the first inverter and b) is connected to an output end of the first inverter;
   a first transistor, connected to the output end of the first inverter and connected to the input end of the second inverter, which is turned on according to a first word level of a word line to set a first bit line to a first bit level opposite to a level of the input end of the first inverter; and
   a second transistor, connected to an output end of the second inverter, which is turned on according to the first level of the word line to set a second bit line to a second bit level opposite to a level of the input end of the second inverter.

2. The semiconductor memory according to claim 1, further comprising:
   a write-in control unit for setting the word line, which is connected to both the first transistor and the second transistor of the storage value fixing memory cell, to the first word level according to an address signal specifying the storage value fixing memory cell.

3. The semiconductor memory according to claim 2, wherein the write-in control unit comprises:
   a first AND gate for outputting a read signal of the first word level to both the first transistor and the second transistor of the storage value fixing memory cell in response to both a read request signal of a high level and a first decode signal set to the high level by the address signal in the data read operation and outputting a non-write signal set to a level opposite to the first word level to both the first transistor and the second transistor of the storage value fixing memory cell in response to a write request signal of a low level in the data write operation regardless of the level of the first decode signal; and
   a second AND gate, connected to the corresponding read/write memory cell, for receiving a second decode signal and outputting a read signal or a write signal of the high level to the corresponding read/write memory cell in the data read operation or the data write operation in cases where the second decode signal is set to the high level according to the address signal.

4. The semiconductor memory according to claim 1, wherein the input end of the second inverter of the storage value fixing memory cell is connected to the high electric potential terminal or is connected to the low electric potential terminal.

5. The semiconductor memory according to claim 4, wherein the bit data of a first value is fixedly stored in the storage value fixing memory cell in which the input end of the first inverter is connected to the low electric potential terminal and the input end of the second inverter is connected to the high electric potential terminal, and the bit data of a second value is fixedly stored in the storage value fixing memory cell in which the input end of the second inverter is connected to the low electric potential terminal and the input end of the first inverter is connected to the high electric potential terminal.

6. The semiconductor memory according to claim 1, wherein the bit data of a first value is fixedly stored in the storage value fixing memory cell in which the input end of the first inverter is connected to the low electric potential terminal, and the bit data of a second value is fixedly stored in the storage value fixing memory cell in which the input end of the first inverter is connected to the high electric potential terminal.

7. A semiconductor memory write-in control device, comprising:
   a central processing unit for outputting one of a write-in request signal and a read-out request signal according to a read/write control program;
   a storage value fixing memory cell from which bit data is read out according to the read-out request signal output from the central processing unit; and
   a plurality of read/write memory cells from which bit data is read out according to the read-out request signal output from the central processing unit in a case where no bit data is read out from the storage value fixing memory cell regardless of the reception of the read-out request signal and in which bit data is written according to the write-in request signal output from the central processing unit, wherein the storage value fixing memory cell comprises
   a first inverter of which an input end is connected to one of a low electric potential terminal and a high electric potential terminal;
   a second inverter of which an input end a) is set to a level opposite to that of the input end of the first inverter and b) is connected to an output end of the first inverter;
   a first transistor, connected to output end of the first inverter and connected to the input end of the second inverter, which is turned on according to a first word level of a word line to set a first bit line to a first bit level opposite to a level of the input end of the first inverter; and
   a second transistor, connected to an output end of the second inverter, which is turned on according to the first level of the word line to set a second bit line to a second bit level opposite to a level of the input end of the second inverter.

8. The semiconductor memory write-in control device according to claim 7, wherein no write-in request signal is output from the central processing unit to the storage value fixing memory cell according to the read/write control program in a case where the first transistor and the second transistor are turned on according to the first word level of the word line.

9. A semiconductor memory comprising:
   a plurality of memory cells of the semiconductor memory are formed as read/write memory cell before determination of preset data and/or preset program codes, and at least a part of said plurality of memory cells are converted by alternation of connection into storage value fixing memory cell after determination of preset data and/or preset program codes to store the preset data and/or preset program codes.

\* \* \* \* \*